United States Patent
Yedla et al.

(10) Patent No.: US 11,817,331 B2
(45) Date of Patent: Nov. 14, 2023

(54) SUBSTRATE HOLDER REPLACEMENT WITH PROTECTIVE DISK DURING PASTING PROCESS

(71) Applicant: Applied Materials, Inc., Santa Clara, CA (US)

(72) Inventors: Srinivasa Rao Yedla, Bangalore (IN); Kirankumar Neelasandra Savandaiah, Bangalore (IN); Thomas Brezoczky, Los Gatos, CA (US); Bhaskar Prasad, Jamshedpur (IN); Nitin Bharadwaj Satyavolu, Kakinada (IN)

(73) Assignee: Applied Materials, Inc., Santa Clara, CA (US)

( * ) Notice: Subject to any disclaimer, the term of this patent is extended or adjusted under 35 U.S.C. 154(b) by 402 days.

(21) Appl. No.: 16/940,058

(22) Filed: Jul. 27, 2020

(65) Prior Publication Data
US 2022/0028711 A1    Jan. 27, 2022

(51) Int. Cl.
*H01L 21/67* (2006.01)
*B65G 29/00* (2006.01)
*B25J 15/00* (2006.01)

(52) U.S. Cl.
CPC ...... *H01L 21/67196* (2013.01); *B25J 15/009* (2013.01); *B25J 15/0019* (2013.01); *B65G 29/00* (2013.01); *H01L 21/67167* (2013.01); *B65G 2201/0297* (2013.01); *B65G 2814/0313* (2013.01)

(58) Field of Classification Search
CPC .......... H01L 21/67; H01L 21/68; C23C 16/00
See application file for complete search history.

(56) References Cited

U.S. PATENT DOCUMENTS

| | | | |
|---|---|---|---|
| 5,863,170 | A | 1/1999 | Boitnott et al. |
| 5,879,459 | A | 3/1999 | Gadgil et al. |
| 6,162,299 | A | 12/2000 | Raaijmakers |
| 6,440,261 | B1 | 8/2002 | Tepman et al. |
| 6,447,607 | B2 | 9/2002 | Soininen et al. |
| 6,576,062 | B2 | 6/2003 | Matsuse |
| 6,604,853 | B2 | 8/2003 | Chao et al. |

(Continued)

FOREIGN PATENT DOCUMENTS

| | | |
|---|---|---|
| CN | 100411095 C | 8/2008 |
| CN | 102965643 B | 2/2016 |

(Continued)

OTHER PUBLICATIONS

International Search Report dated Aug. 4, 2021 for application No. PCT/US2021/026831.

(Continued)

*Primary Examiner* — Ronald P Jarrett
(74) *Attorney, Agent, or Firm* — Patterson + Sheridan, LLP (57) ABSTRACT

A shutter disc for use in a cluster tool assembly having a processing chamber and a transfer arm includes an inner disc and an outer disc configured to be disposed on the inner disc. The inner disc includes a plurality of locating features configured to mate with locating pins of a transfer arm of a cluster tool assembly and a plurality of centering features configured to mate with alignment elements of a substrate support disposed in the processing chamber of the cluster tool assembly.

17 Claims, 7 Drawing Sheets

(56) References Cited

U.S. PATENT DOCUMENTS

| | | |
|---|---|---|
| 6,635,115 B1 | 10/2003 | Fairbairn et al. |
| 6,852,194 B2 | 2/2005 | Matsushita et al. |
| 6,962,471 B2 | 11/2005 | Birkner et al. |
| 7,066,703 B2 | 6/2006 | Johnson |
| 7,090,741 B2 | 8/2006 | Narushima et al. |
| D527,751 S | 9/2006 | Kondoh et al. |
| 7,138,336 B2 | 11/2006 | Lee et al. |
| 7,169,234 B2 | 1/2007 | Weeks et al. |
| 7,189,432 B2 | 3/2007 | Chiang et al. |
| 7,258,768 B2 | 8/2007 | Yamazaki |
| 7,318,869 B2 | 1/2008 | Chiang et al. |
| 7,422,406 B2 | 9/2008 | van der Meulen |
| 7,458,763 B2 | 12/2008 | van der Meulen |
| 7,537,662 B2 | 5/2009 | Soininen et al. |
| 7,784,164 B2 | 8/2010 | White et al. |
| 7,799,179 B2 | 9/2010 | Maass et al. |
| 7,806,983 B2 | 10/2010 | Chiang et al. |
| 7,833,352 B2 | 11/2010 | Bondestam et al. |
| 7,905,991 B2 | 3/2011 | Esselbach et al. |
| 7,959,403 B2 | 6/2011 | van der Meulen |
| 7,988,399 B2 | 8/2011 | van der Meulen |
| 8,029,226 B2 | 10/2011 | van der Meulen |
| 8,033,772 B2 | 10/2011 | Kurita et al. |
| 8,088,678 B2 | 1/2012 | Kitano et al. |
| 8,197,177 B2 | 6/2012 | van der Meulen et al. |
| 3,216,380 A1 | 7/2012 | White et al. |
| 8,267,632 B2 | 9/2012 | van der Meulen et al. |
| 8,292,563 B2 | 10/2012 | Haris |
| 8,313,277 B2 | 11/2012 | van der Meulen et al. |
| 8,354,656 B2 | 1/2013 | Beloussov et al. |
| 8,403,613 B2 | 3/2013 | van der Meulen |
| 8,434,989 B2 | 5/2013 | van der Meulen |
| 8,439,623 B2 | 5/2013 | van der Meulen |
| 8,500,388 B2 | 8/2013 | van der Meulen et al. |
| 8,523,507 B2 | 9/2013 | van der Meulen |
| 8,558,299 B2 | 10/2013 | Cao et al. |
| 8,574,409 B2 | 11/2013 | Kadlec et al. |
| 8,602,716 B2 | 12/2013 | van der Meulen et al. |
| 8,672,605 B2 | 3/2014 | van der Meulen et al. |
| 8,696,298 B2 | 4/2014 | van der Meulen et al. |
| 8,728,239 B2 | 5/2014 | Bauer et al. |
| 8,807,905 B2 | 8/2014 | Meulen |
| 8,812,150 B2 | 8/2014 | van der Meulen et al. |
| 8,870,513 B2 | 10/2014 | Voser et al. |
| 8,870,514 B2 | 10/2014 | van der Meulen et al. |
| 8,895,450 B2 | 11/2014 | Cao et al. |
| 8,944,738 B2 | 2/2015 | van der Meulen |
| 8,945,308 B2 | 2/2015 | Schaller |
| 9,005,539 B2 | 4/2015 | Halpin et al. |
| 9,085,825 B2 | 7/2015 | Kim |
| 9,103,030 B2 | 8/2015 | Kato et al. |
| 9,214,589 B2 | 12/2015 | Voser et al. |
| 9,252,037 B2 | 2/2016 | Scholte Von Mast et al. |
| 9,281,222 B2 | 3/2016 | Weaver et al. |
| 9,336,997 B2 | 5/2016 | Bera |
| 9,340,874 B2 | 5/2016 | Halpin et al. |
| 9,347,131 B2 | 5/2016 | Maass et al. |
| 9,355,824 B2 | 5/2016 | Kadlec et al. |
| 9,378,994 B2 | 6/2016 | Weaver et al. |
| 9,396,981 B2 | 7/2016 | Scholte Von Mast et al. |
| 9,443,749 B2 | 9/2016 | Wakabayashi et al. |
| 9,478,420 B2 | 10/2016 | Castaldi et al. |
| 9,490,149 B2 | 11/2016 | Chandrasekharan et al. |
| 9,551,068 B2 | 1/2017 | Kumagai et al. |
| 9,583,349 B2 | 2/2017 | Gandikota et al. |
| 9,587,306 B2 | 3/2017 | Rohrmann et al. |
| 9,644,261 B2 | 5/2017 | Weichart et al. |
| 9,698,009 B2 | 7/2017 | Sato et al. |
| 9,831,094 B2 | 11/2017 | Rahtu et al. |
| 9,842,755 B2 | 12/2017 | Ocker et al. |
| 9,884,726 B2 | 2/2018 | van der Meulen et al. |
| 9,890,473 B2 | 2/2018 | Newman |
| 9,929,008 B2 | 3/2018 | Wamura et al. |
| 9,932,674 B2 | 4/2018 | Kato et al. |
| 9,953,843 B2 | 4/2018 | Shen et al. |
| 9,960,072 B2 | 5/2018 | Coomer |
| 10,043,693 B1 | 8/2018 | Kim et al. |
| 10,086,511 B2 | 10/2018 | van der Meulen |
| 10,138,553 B2 | 11/2018 | Scholte Von Mast et al. |
| 10,145,014 B2 | 12/2018 | Nozawa et al. |
| 10,202,682 B2 | 2/2019 | Rieschl et al. |
| 10,202,687 B2 | 2/2019 | Miura et al. |
| 10,221,480 B2 | 3/2019 | Kato et al. |
| 10,256,125 B2 | 4/2019 | Weaver et al. |
| 10,262,888 B2 | 4/2019 | Gangakhedkar et al. |
| 10,347,515 B2 | 7/2019 | Heinz |
| 10,388,559 B2 | 8/2019 | Rieschl et al. |
| 10,427,303 B2 | 10/2019 | Weaver et al. |
| 10,586,720 B2 | 3/2020 | Weaver et al. |
| 2002/0051698 A1 | 5/2002 | Birkner et al. |
| 2002/0170671 A1 | 11/2002 | Matsushita et al. |
| 2003/0109094 A1 | 6/2003 | Seidel et al. |
| 2004/0159553 A1 | 8/2004 | Nogami et al. |
| 2004/0182698 A1 | 9/2004 | Feltsman |
| 2004/0261710 A1 | 12/2004 | Matsushita et al. |
| 2005/0005850 A1 | 1/2005 | Yamazaki |
| 2005/0006230 A1 | 1/2005 | Narushima et al. |
| 2005/0111936 A1 | 5/2005 | Kim et al. |
| 2005/0115822 A1 | 6/2005 | Maass et al. |
| 2005/0118009 A1 | 6/2005 | van der Meulen |
| 2006/0051507 A1 | 3/2006 | Kurita et al. |
| 2006/0056952 A1 | 3/2006 | Haris |
| 2006/0101728 A1 | 5/2006 | White et al. |
| 2006/0137608 A1 | 6/2006 | Choi et al. |
| 2006/0137609 A1 | 6/2006 | Puchacz et al. |
| 2006/0157340 A1 | 7/2006 | Kurita et al. |
| 2006/0201074 A1 | 9/2006 | Kurita et al. |
| 2006/0263177 A1 | 11/2006 | Meulen |
| 2007/0020890 A1 | 1/2007 | Thakur et al. |
| 2007/0215036 A1 | 9/2007 | Park et al. |
| 2007/0281090 A1 | 12/2007 | Kurita et al. |
| 2008/0014055 A1 | 1/2008 | van der Meulen |
| 2008/0072821 A1 | 3/2008 | Dalton et al. |
| 2008/0124194 A1 | 5/2008 | van der Meulen et al. |
| 2008/0124197 A1 | 5/2008 | van der Meulen et al. |
| 2008/0138176 A1 | 6/2008 | Kim et al. |
| 2008/0187417 A1 | 8/2008 | van der Meulen et al. |
| 2008/0219808 A1 | 9/2008 | van der Meulen et al. |
| 2008/0219812 A1 | 9/2008 | van der Meulen et al. |
| 2008/0226429 A1 | 9/2008 | van der Meulen |
| 2008/0232947 A1 | 9/2008 | van der Meulen et al. |
| 2009/0087286 A1 | 4/2009 | Meulen |
| 2009/0173622 A1 | 7/2009 | Weichart et al. |
| 2009/0180847 A1 | 7/2009 | Guo et al. |
| 2010/0012036 A1 | 1/2010 | Silva et al. |
| 2010/0075453 A1 | 3/2010 | Kurita et al. |
| 2010/0120238 A1 | 5/2010 | Kitano et al. |
| 2010/0281683 A1 | 11/2010 | White et al. |
| 2010/0304027 A1 | 12/2010 | Lee et al. |
| 2010/0327187 A1 | 12/2010 | Beloussov et al. |
| 2012/0027542 A1 | 2/2012 | Isomura et al. |
| 2012/0031749 A1 | 2/2012 | Dubs et al. |
| 2012/0328797 A1 | 12/2012 | Maass et al. |
| 2013/0302115 A1 | 11/2013 | Wakabayashi et al. |
| 2014/0262035 A1 | 9/2014 | Merry et al. |
| 2014/0271081 A1* | 9/2014 | Lavitsky ........... H01L 21/67748 414/744.2 |
| 2014/0349011 A1 | 11/2014 | Weichart |
| 2015/0063957 A1 | 3/2015 | Olgado |
| 2015/0240360 A1 | 8/2015 | Leeser |
| 2015/0364301 A1 | 12/2015 | Yamaguchi et al. |
| 2016/0108515 A1 | 4/2016 | Elghazzali et al. |
| 2016/0138159 A1 | 5/2016 | Kato et al. |
| 2017/0175247 A1 | 6/2017 | Weichart |
| 2017/0218514 A1 | 8/2017 | Kato et al. |
| 2018/0142350 A1 | 5/2018 | Fukiage et al. |
| 2018/0195173 A1 | 7/2018 | Kato et al. |
| 2018/0245212 A1 | 8/2018 | Schwyn-Thony et al. |
| 2018/0245218 A1 | 8/2018 | Kato |
| 2018/0261473 A1 | 9/2018 | Weichart et al. |
| 2018/0334745 A1 | 11/2018 | Kato |
| 2019/0013225 A1 | 1/2019 | Taguchi et al. |
| 2019/0096715 A1 | 3/2019 | Lodder et al. |

(56) References Cited

U.S. PATENT DOCUMENTS

| | | | |
|---|---|---|---|
| 2019/0252160 | A1 | 8/2019 | Baton et al. |
| 2019/0252166 | A1 | 8/2019 | Felzer et al. |
| 2019/0348264 | A1 | 11/2019 | Tsai et al. |

FOREIGN PATENT DOCUMENTS

| | | | | |
|---|---|---|---|---|
| CN | 105200393 | B | 10/2018 | |
| DE | 10350517 | A1 | 6/2005 | |
| DE | 102012103295 | A1 | 7/2013 | |
| DE | 102013111790 | A1 | 4/2015 | |
| DE | 102013113052 | A1 | 5/2015 | |
| EP | 2102889 | A2 | 9/2009 | |
| JP | H0963959 | * | 3/1997 | ........... H01L 21/203 |
| JP | 2004-131832 | | 4/2004 | |
| JP | 5088284 | B2 | 12/2012 | |
| JP | 5315898 | B2 | 10/2013 | |
| JP | 5544697 | B2 | 7/2014 | |
| JP | 5870568 | B2 | 3/2016 | |
| JP | 6330623 | B2 | 5/2018 | |
| JP | 6464765 | B2 | 2/2019 | |
| JP | 6478847 | B2 | 3/2019 | |
| JP | 2019036630 | A | 3/2019 | |
| KR | 101887072 | B1 | 8/2018 | |
| WO | 0137317 | A1 | 5/2001 | |
| WO | 2017212077 | A2 | 12/2017 | |
| WO | 2018197305 | A2 | 11/2018 | |
| WO | 2019020391 | A1 | 1/2019 | |
| WO | 2019020393 | A1 | 1/2019 | |
| WO | 2019096515 | A1 | 5/2019 | |
| WO | 2019096564 | A1 | 5/2019 | |
| WO | 2019105671 | A1 | 6/2019 | |
| WO | 2019204185 | A1 | 10/2019 | |

OTHER PUBLICATIONS

International Search Report and Written Opinion dated Sep. 4, 2020 for Application No. PCT/US2020/033456.

* cited by examiner

SUBSTRATE HOLDER REPLACEMENT WITH PROTECTIVE DISK DURING PASTING PROCESS

BACKGROUND

Field

Embodiments of the present disclosure generally relate to substrate processing platforms, which use multiple processing chambers for processing substrates, and more specifically, to a split shutter disk to be used in a process kit for such processing chambers.

Description of the Related Art

Conventional cluster tools are configured to perform one or more processes during substrate processing. For example, a cluster tool can include a physical vapor deposition (PVD) chamber, an atomic layer deposition (ALD) chamber, a chemical vapor deposition (CVD) chamber, and/or one or more other processing chambers for performing one or more other processes on a substrate. In a PVD process, for example, for depositing dielectric materials, a conductive material coating may be applied (i.e., pasted) on inner surfaces of a PVD chamber to minimize particle formations in the inner surfaces of the chamber. During such pasting processes, chamber components need to be protected from deposition of the pasting material via a protective disc (also referred to as a shutter disc). However, one conventional disadvantage while processing substrates in multiple PVD chambers in a single cluster tool system relates to reduced mechanical throughput of the system as time must be allowed for ramping up and ramping down each deposition process.

Therefore, there is the need in the art for a shutter disc for the cluster tool capable of improving the mechanical throughput for processes such as PVD pasting.

SUMMARY

Embodiments of the disclosure include a shutter disc for use in a cluster tool assembly having a processing chamber and a transfer arm. A shutter disc includes an inner disc and an outer disc configured to be disposed on the inner disc. The inner disc includes a plurality of locating features configured to mate with locating pins of a transfer arm of a cluster tool assembly, and a plurality of centering features configured to mate with alignment elements of a substrate support disposed in the processing chamber of the cluster tool assembly.

Embodiments of the disclosure also include a pedestal assembly for use in a processing chamber. A pedestal assembly includes a substrate support that includes a plurality of alignment elements configured to mate with a plurality of centering features disposed on an inner disc of a shutter disc, and a sealing assembly configured to form a seal with a sealing surface of an outer disc of the shutter disc disposed on the inner disc of the shutter disc.

Embodiments of the disclosure also include a cluster tool assembly. A cluster tool assembly includes a central transfer apparatus having a transfer arm configured to transfer and support a shutter disc, and a processing chamber having a pedestal assembly. The transfer arm includes a plurality of locating pins configured to mate with locating features disposed on an inner disc of the shutter disc supposed on the transfer arm. The pedestal assembly includes a substrate support that includes a plurality of alignment elements configured to mate with a plurality of centering features disposed on the inner disc of the shutter disc, and a sealing assembly configured to form a seal with a sealing surface of an outer disc of the shutter disc disposed on the inner disc of the shutter disc.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to substrate processing platforms, which use multiple processing chambers for processing substrates, and more specifically, to a split shutter disk to be used in a process kit for such processing chambers.

The split shutter disc described herein is formed of two split detachable pieces and protects underlying chamber components from material deposition during processes such as a physical vapor deposition (PVD) pasting processes. The split shutter disc includes features for locating and aligning with respect to a substrate support and to a transfer arm, and thus reduces time for exchanging shutter discs and in turn improves the mechanical throughput.

Figure 1:
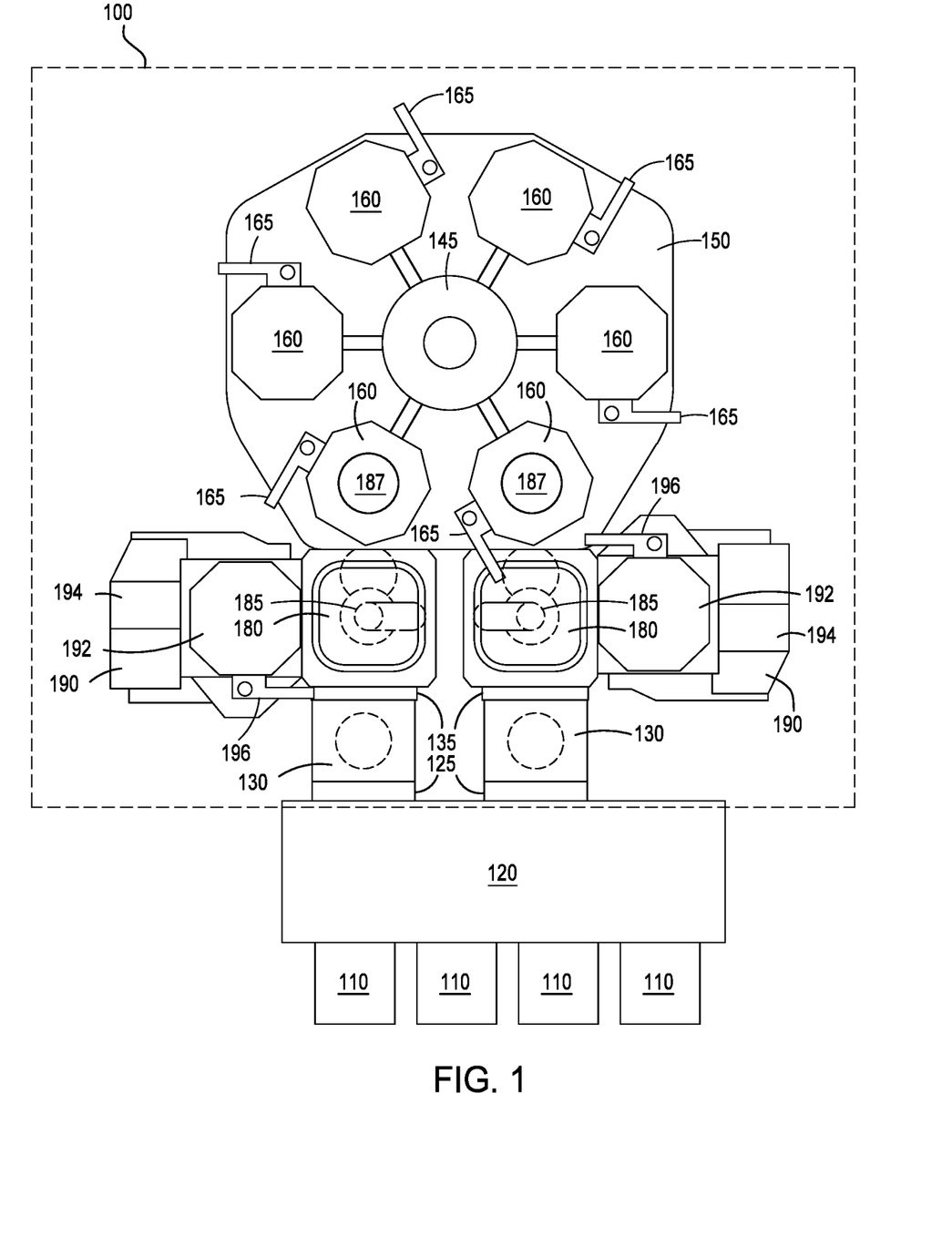
FIG. 1 is a plan view of a cluster tool assembly according to one or more embodiments.

FIG. 1 is a plan view of a cluster tool assembly 100 according to one embodiment. The cluster tool assembly 100 includes a plurality of load lock chambers 130, a plurality of robot chambers 180 adjacent to the plurality of load lock chambers 130, a plurality of prep chambers 190 adjacent to the plurality of robot chambers 180, and a processing module 150 adjacent to the plurality of robot chambers 180. The load lock chambers 130 of the cluster tool assembly 100 are typically coupled to a plurality of front opening unified Pods (FOUPs) 110 by a factory interface 120 adjacent to the FOUPs 110.

The plurality of FOUPs 110 may be utilized to safely secure and store substrates and shutter discs as the substrates and shutter discs are moved between different machines. The plurality of FOUPs 110 may vary in quantity depending upon the process and throughput of the system. The factory interface 120 is disposed between the plurality of FOUPs 110 and the plurality of load lock chambers 130. The factory interface 120 creates an interface between the plurality of FOUPs 110 and the cluster tool assembly 100. The plurality of load lock chambers 130 are connected to the factory interface 120 by first valves 125, such that substrates and shutter discs may be transferred from the factory interface 120 to the plurality of load lock chambers 130 and from the plurality of load lock chambers 130 to the factory interface 120 through the first valves 125. As shown, the first valves 125 are on one wall of the load lock chambers 130. In some embodiments, the first valves 125 are fluid isolation valves and form a seal between the factory interface 120 and the load lock chambers 130. This seal may keep outside contaminants from entering the cluster tool assembly 100. The load lock chambers 130 also each comprise a second valve 135 on an opposite wall from the first valve 125. The second valves 135 interface the load lock chambers 130 with the robot chambers 180.

As shown, the robot chambers 180 are on one side of the load lock chambers 130, such that the load lock chambers 130 are between the factory interface 120 and the robot chambers 180. The robot chambers 180 each include a transfer robot 185. The transfer robot 185 may be any robot suitable to transfer one or more substrates and shutter discs from the load lock chambers 130 to one of the processing chambers 160.

In some embodiments, the transfer robot 185 is configured to transport substrates from the load lock chambers 130 and into the plurality of prep chambers 190. The transfer robot 185 removes a substrate from the load lock chambers 130, moves the substrate into the robot chamber 180, and then moves the substrate into the prep chamber 190. Similarly to how a substrate may be moved to the prep chambers 190 from the load lock chambers 130 by the transfer robot 185, a substrate may also be moved from the prep chamber 190 to the load lock chambers 130 by the transfer robot 185. The transfer robot 185 may also move substrates from the processing module 150 to the prep chambers 190 or the load lock chambers 130. In some alternative embodiments, the transfer robot 185 may move a substrate or a shutter disc from the load lock chambers 130, move the substrate or the shutter disc into the robot chamber 180, and then move the substrate or the shutter disc into the processing module 150. In this alternative embodiment, the substrate may not enter the prep chamber 190 either before processing in the processing module 150 or after processing in the processing module 150.

The prep chambers 190 include a cleaning chamber 192, a packaging structure 194, and a cleaning chamber pump 196. The cleaning chamber 192 may be any one of a pre-clean chamber, an anneal chamber, or a cool down chamber, depending upon the desired process within the cluster tool assembly 100. In some embodiments, the cleaning chamber 192 is a wet clean chamber. In other embodiments, the cleaning chamber 192 is a plasma clean chamber. In yet other exemplary embodiments, the cleaning chamber 192 is a Preclean II chamber available from Applied Materials, Inc., of Santa Clara, Calif.

The packaging structure 194 may be a structural support for the cleaning chamber 192. The packaging structure 194 may include a sub-transfer chamber (not shown), a gas supply (not shown), and an exhaust port (not shown). The packaging structure 194 may provide the structure around the cleaning chamber 192 and interface the cleaning chamber 192 to the robot chamber 180. The cleaning chamber pump 196 is disposed adjacent to a wall of the cleaning chamber 192 and provides control of the pressure within the cleaning chamber 192. One cleaning chamber pump 196 may be adjacent to each of the cleaning chambers 192. The cleaning chamber pump 196 may be configured to provide a pressure change to the cleaning chamber 192. In some embodiments, the cleaning chamber pump 196 is configured to increase the pressure of the cleaning chamber 192. In other embodiments, the cleaning chamber pump 196 is configured to decrease the pressure of the cleaning chamber 192, such as to create a vacuum within the cleaning chamber 192. In yet other embodiments, the cleaning chamber pump 196 is configured to both increase and decrease the pressure of the cleaning chamber 192 depending on the process being utilized within the cluster tool assembly 100. The cleaning chamber pump 196 may be held in place by the packaging structure 194, such that the packaging structure 194 at least partially surrounds the cleaning chamber pump 196.

As shown, the processing module 150 is adjacent to the robot chambers 180, such that the processing module 150 is connected to the robot chambers 180 by a valve (not shown). The processing module 150 may be attached to a third wall of the robot chambers 180. The third wall of the robot chambers 180 may be opposite the first wall of the robot chambers 180.

A chamber pump 165 is disposed adjacent to each of the processing chambers 160, such that a plurality of chamber pumps 165 are disposed around the central transfer apparatus 145. The plurality of chamber pumps 165 may also be disposed radially outward of the central transfer apparatus 145 in the processing module 150. One chamber pump 165 for each of the processing chambers 160 is provided, such that one chamber pump 165 is connected to each of the processing chambers 160. In some embodiments, multiple chamber pumps 165 per processing chamber 160 are provided. In yet other embodiments, a processing chamber 160 may not have a chamber pump 165. A varying number of chamber pumps 165 per processing chamber 160 may be provided, such that one or more processing chambers 160 may have a different number of chamber pumps 165 than a separate set of processing chambers 160. In some embodiments, the chamber pumps 165 are configured to increase the pressure of the processing chamber 160. In other embodiments, the cleaning chamber pumps 196 are configured to decrease the pressure of the processing chamber 160, such as to create a vacuum within the processing chamber 160. In yet other embodiments, the chamber pumps 165 are configured to both increase and decrease the pressure of the processing chambers 160 depending on the process being utilized within the cluster tool assembly 100.

In the embodiment shown in FIG. 1, the processing module 150 includes six processing chambers 160. In one embodiment, the processing module 150 includes a single processing chamber 160. In another embodiment, two or more processing chambers 160 are provided. In some embodiments, two to twelve processing chambers 160 are within the processing module 150. In other embodiments, four to eight processing chambers 160 are within the processing module 150. The number of processing chambers 160 impacts the total footprint of the cluster tool assembly 100, the number of possible process steps capable of being performed by the cluster tool assembly 100, the total fabrication cost of the cluster tool assembly 100, and the throughput of the cluster tool assembly 100.

The plurality of processing chambers 160 can be any one of a physical vapor deposition (PVD), a chemical vapor deposition (CVD), an atomic layer deposition (ALD), etch, cleaning, heating, annealing, and polishing platforms. In some embodiments, the plurality of processing chambers 160 can all be similar platforms. In other embodiments, the plurality of processing chambers 160 can include two or more types of processing platforms. In one exemplary embodiment, all of the plurality of processing chambers 160 are PVD process chambers. In another exemplary embodiment, the plurality of processing chambers 160 includes both PVD and CVD process chambers. Other embodiments of the makeup of the plurality of processing chambers 160 are envisioned. The plurality of processing chambers 160 can be altered to match the types of process chambers needed to complete a process.

Figure 2:
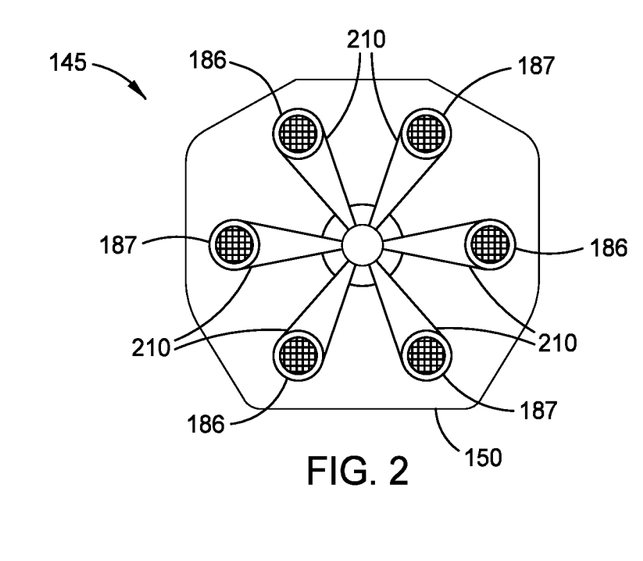
FIG. 2 is a schematic view of a central transfer apparatus according to one or more embodiments.

The central transfer apparatus 145 is disposed in the center of the processing module 150, such that the central transfer apparatus 145 is disposed around a central axis of the processing module 150. The central transfer apparatus 145 may be any suitable transfer device. The central transfer apparatus 145 is configured to transport a substrate disposed on an electrostatic chuck (ESC, not shown) or a shutter disc to and from each of the processing chambers 160. In one embodiment, the central transfer apparatus 145 is configured as a carousel system as illustrated in FIG. 2. A plurality of transfer arms 210 radially extend from the central transfer apparatus 145. In some embodiments, as the number of transfer arms 210 is equal to the number of processing chambers 160 of the processing module 150. However, the number of transfer arms 210 of the central transfer apparatus 145 can be less than or greater than the number of processing chambers 160 of the processing module 150. In one embodiment, the number of transfer arms 210 is greater than the number of processing chambers 160 to allow more substrates 186 to be transferred at one time and/or allow some of the transfer arms 210 to support additional hardware components, such as shutter discs 187 that are used to perform a PVD pasting process to remove contamination from a surface of a PVD target. A PVD pasting process is typically performed in a processing chamber 160 between two substrate PVD deposition processes performed in the same processing chambers 160.

A shutter disc 187, when in one of the processing chambers 160, forms a boundary within the processing chamber 160 and protects underlying chamber components in the processing chambers 160 from unwanted deposition during PVD pasting processes.

Figure 3A:
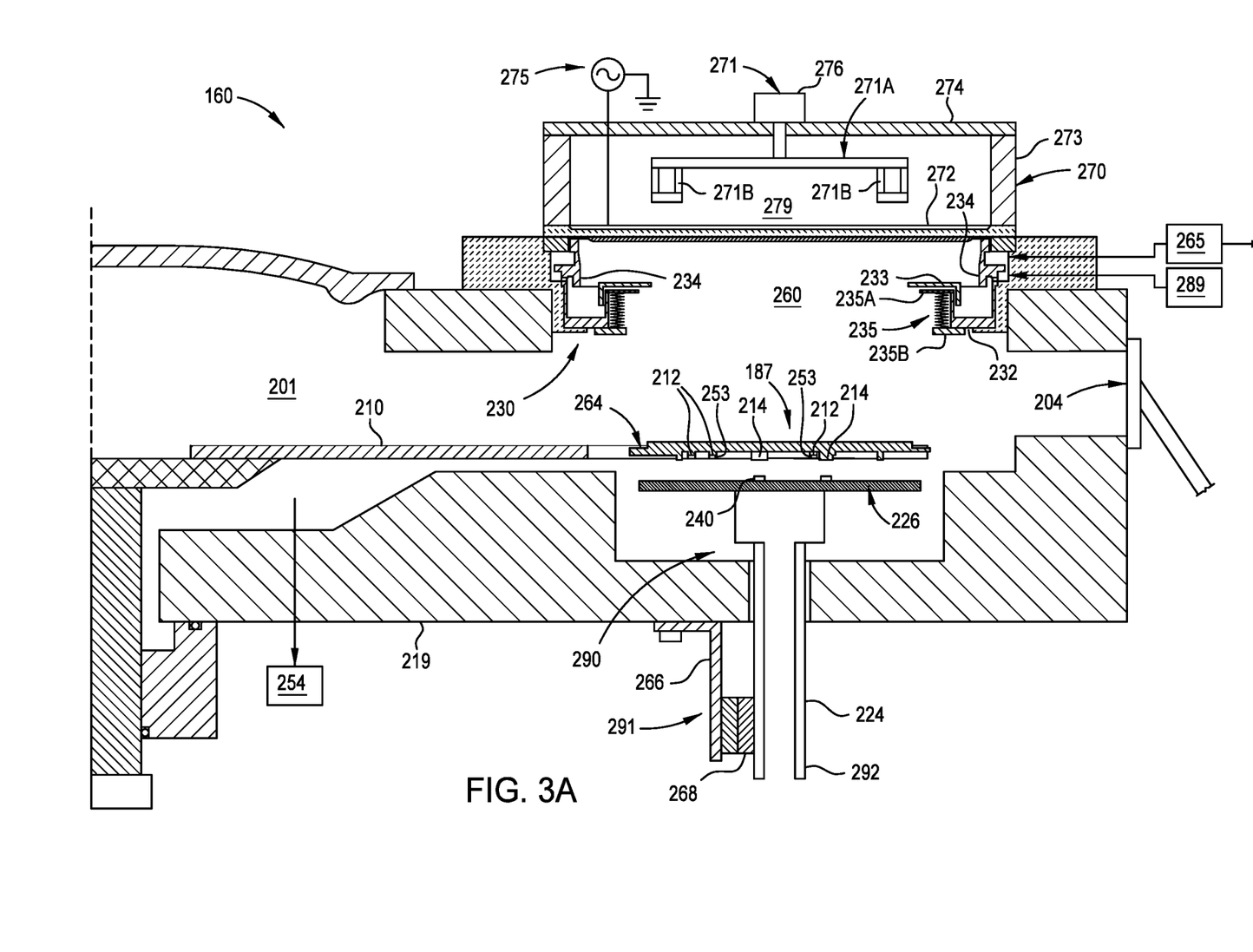
FIGS. 3A and 3B are schematic sectional side views of a processing chamber according to one or more embodiments.
Figure 3B:
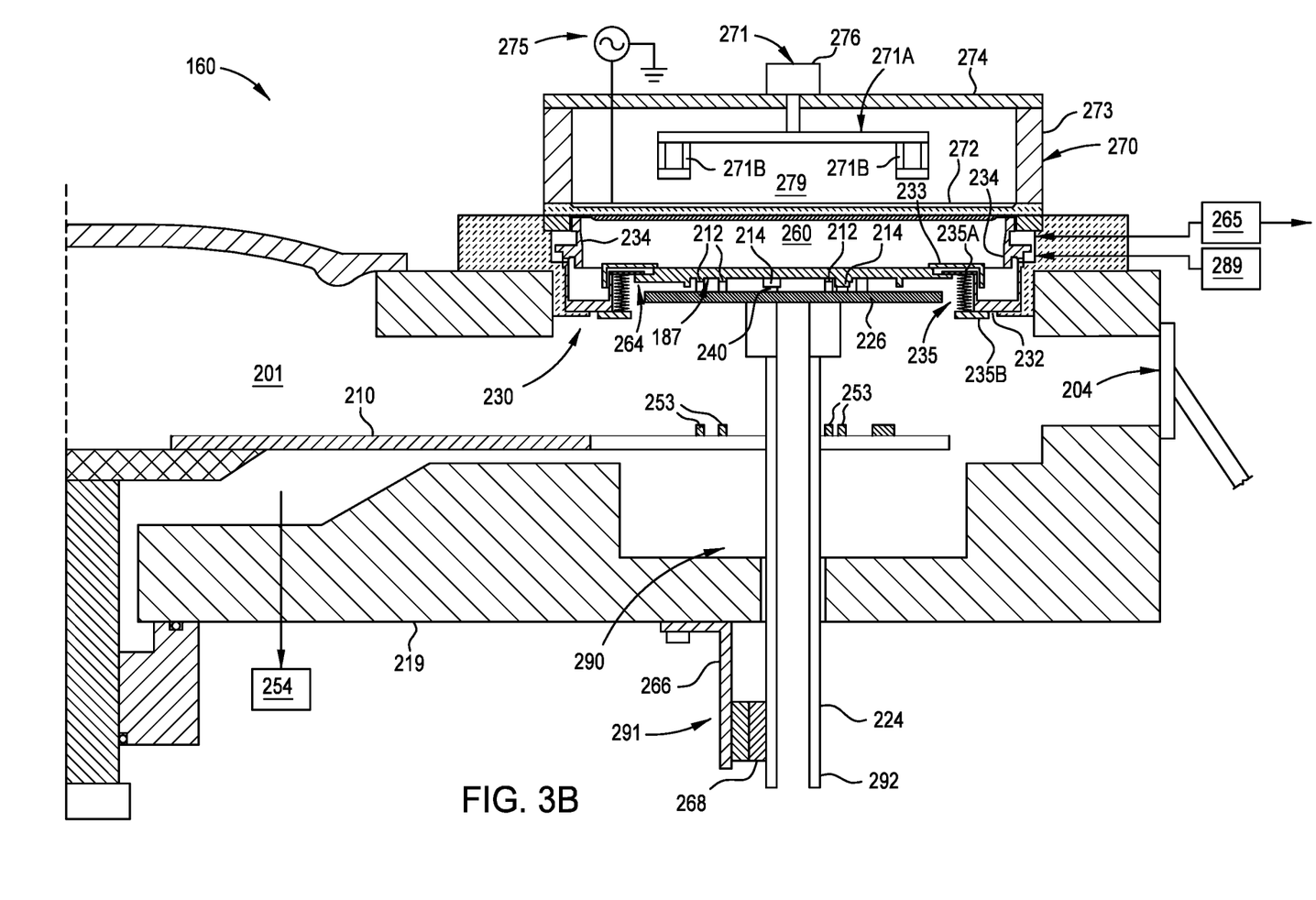
Figure 4A:
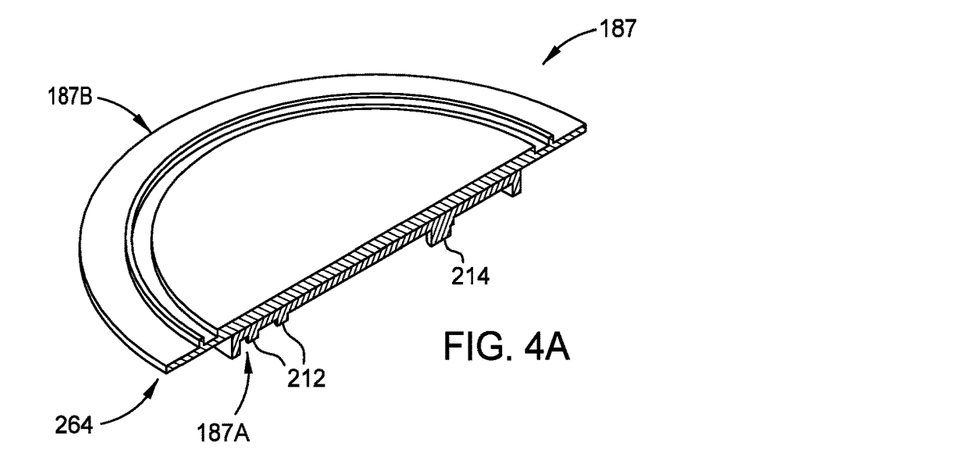
FIGS. 4A, 4B, 4C, and 4D are a schematic view, a bottom view, a top view, and a partial enlarged cross-sectional view of a shutter disc according to one or more embodiments.
Figure 4B:
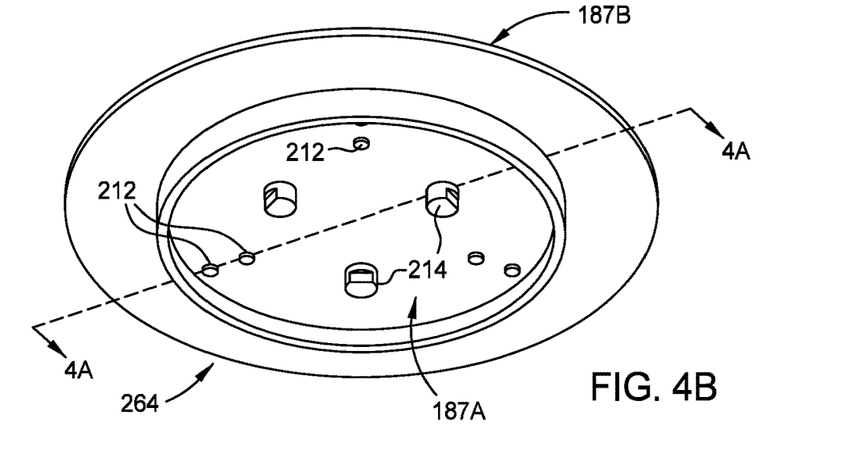
Figure 4C:
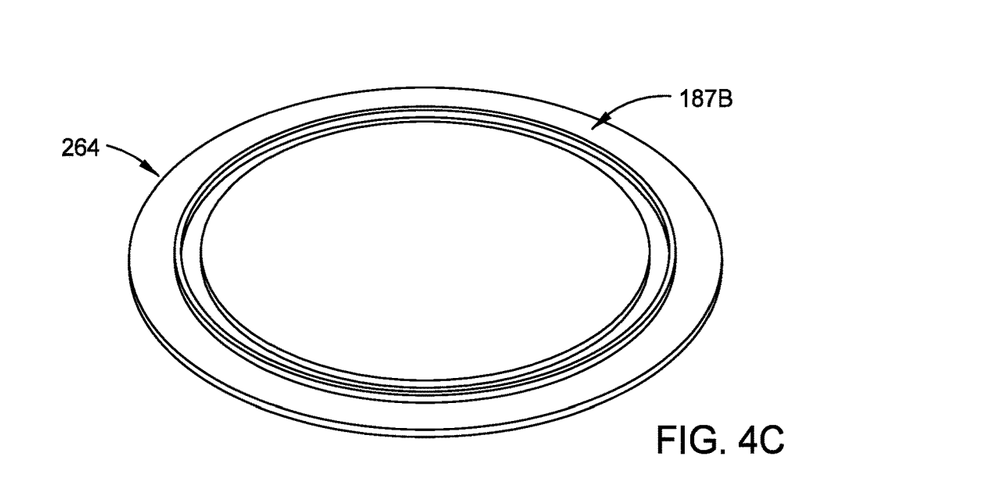
Figure 4D:
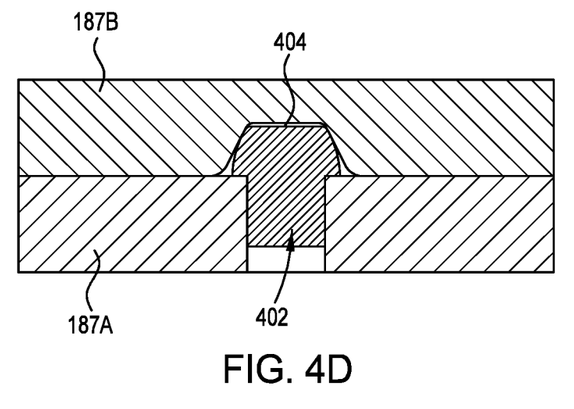

FIGS. 3A and 3B are schematic sectional side views of a processing chamber 160. The processing chamber 160 is serviced via a central transfer apparatus (e.g., the central transfer apparatus 145 of FIG. 1) to transfer shutter discs (e.g., the shutter disc 187) and substrates (e.g., the substrate 186 on an ESC) into and out of the processing chamber 160. A transfer opening 204 extends inwardly of the outer surface of a circumferential wall of the processing chamber 160 and into a transfer region 201 of the processing chamber 160. The transfer opening 204 allows the transfer robot 185 to transfer the shutter disc 187 or a substrate on the ESC into and out of the transfer region 201. In various embodiments, the transfer opening 204 may be omitted. For example, in embodiments where the processing chamber 160 does not interface with the transfer robot 185, the transfer opening 204 may be omitted.

A source assembly 270 of the processing chamber 160 is configured to perform a deposition process (e.g., a PVD deposition process). In this configuration, the source assembly 270 includes a target 272, a magnetron assembly 271, a source assembly wall 273, a lid 274, and a sputtering power supply 275. The magnetron assembly 271 includes a magnetron region 279 in which a magnetron 271A is rotated by use of a magnetron rotation motor 276 during processing. The target 272 and magnetron assembly 271 are typically cooled by the delivery of a cooling fluid (e.g., DI water) to the magnetron region 279 from a fluid recirculation device (not shown). The magnetron 271A includes a plurality of magnets 271B that are configured to generate magnetic fields that extend below the lower surface of the target 272 to promote a sputtering process in a processing volume 260 during a PVD deposition process.

In alternate configurations of the processing chamber 160, which are adapted to perform CVD, plasma enhanced CVD (PECVD), ALD, plasma enhanced ALD (PEALD), etch, heating, or annealing processes, the source assembly 270 generally includes different hardware components. In one example, the source assembly 270 of a processing chamber 160 that is adapted to perform a PECVD deposition process or etch process includes a gas distribution plate, or showerhead, that is configured to deliver a precursor gas or etching gas into the processing volume 260 and across a surface of a substrate disposed within the processing chamber 160 during processing. In this case, the magnetron assembly 271 and target are not used, and the sputtering power supply 275 is replaced with an RF power supply that is configured to bias the gas distribution plate.

A substrate support actuation assembly 290 includes a pedestal lift assembly 291 and a pedestal assembly 224. The pedestal lift assembly 291 includes a lift actuator assembly 268 and a lift mounting assembly 266, which is coupled to a base 219 of the processing chamber 160. During operation, the lift actuator assembly 268 and the lift mounting assembly 266 are configured to position the pedestal assembly 224 in at least a transfer position (FIG. 3A), which is positioned vertically (Z-direction) below a transfer arm 210 of the central transfer apparatus 145 (i.e., transfer plane), and a processing position (FIG. 3B), which is vertically above the transfer arm 210. Further, the lift actuator assembly 268 and the lift mounting assembly 266 apply vertical motion, in the +Z direction, to the pedestal assembly 224 to pick the shutter disc 187 or a substrate on an ESC off of the transfer arm 210. Additionally, the lift actuator assembly 268 and the lift mounting assembly 266 apply vertical motion, in the −Z direction, to the pedestal assembly 224 to position the shutter disc 187 or the substrate on the ESC on the transfer arm 210.

The lift actuator assembly 268 is coupled to a pedestal shaft 292, which is supported by bearings (not shown) that are coupled to the base 219 of the processing module 150 to guide the pedestal shaft 292 as it is translated by the lift actuator assembly 268. A bellows assembly (not shown) is used to form a seal between the outer diameter of the pedestal shaft 292 and a portion of the base 219, such that a vacuum environment created within the transfer region 201 by use of a pump 254 is maintained during normal operation.

The transfer arm 210 includes one or more locating pins 253 to locate the shutter disc 187 in the transfer position (FIG. 3A). The shutter disc 187 includes one or more locating features 212 that are configured to mate (e.g., physically couple) with the locating pins 253 of the transfer arm 210. The locating pins 253 of the transfer arm 210 may be formed of molybdenum (Mo), tungsten (W), or Kovar® Ni—Fe alloy.

The pedestal assembly 224 includes a substrate support 226 that is coupled to the pedestal shaft 292. The substrate support 226 supports the shutter disc 187 or a substrate on the ESC within the processing chamber 160 in the processing position (FIG. 3B). The substrate support 226 includes one or more alignment elements 240 to center the shutter disc 187 over the substrate support 226 in the processing position (FIG. 3B). The shutter disc 187 further includes one or more centering features 214 that are configured to mate (e.g., physically couple) with the alignment elements 240 of the substrate support 226. The alignment elements 240 of the substrate support 226 may be formed of molybdenum (Mo) or tungsten (W), or a combination thereof. Alternatively, the alignment elements 240 may be formed of a material other than molybdenum (Mo) or tungsten (W), or a combination of materials including or not including molybdenum (Mo) and tungsten (W).

The alignment elements 240 are removably coupled or non-removably (or permanently) coupled to the substrate support 226. For example, in one embodiment, the alignment elements 240 are removably coupled and may be attached via fasteners (not shown) and removed from the substrate support 226 such that the alignment elements 240 may be replaced without damaging the substrate support 226. The fasteners may be a nut or similar type of fastener device. In one embodiment, the fasteners may be removed such that the alignment elements 240 may be replaced. For example, removing the fastener allows the alignment elements 240 to be removed and an alignment element 240 to be coupled to the substrate support 226 via the fastener. The contacts between the alignment elements 240 of the substrate support 226 and the centering features 214 of the shutter disc 187 causes wear to the alignment elements 240. Over time, the alignment elements 240 may need to be replaced. Removably coupling the alignment elements 240 to the substrate support 226 allows the alignment elements 240 to be removed and replaced when wear affects the operation of the alignment elements 240 and degrades the coupling between the alignment elements 240 and the centering features 214.

A process kit assembly 230 generally includes a process region shield 232 and a sealing assembly 235. A station wall 234 includes a first port that is coupled to a vacuum pump 265 and is configured to evacuate the processing volume 260 through a circumferential gap formed between an upper portion of the process region shield 232, lower surface of the target 272 and a portion of an isolation ring 233 and the station wall 234 during processing. The station wall 234 is coupled to a gas source assembly 289, and is configured to deliver one or more process gases (e.g., Ar, $N_2$) to the processing volume 260 through a circumferential plenum during processing.

In the processing position (FIG. 3B), the shutter disc 187 or the substrate on the ESC are positioned below the source assembly 270. The shutter disc 187 includes a sealing surface 264 that forms a seal with a portion of the sealing assembly 235 so as to substantially fluidly isolate the processing volume 260 from the transfer region 201 in the processing position (FIG. 3B). Thus, the shutter disc 187, the sealing assembly 235, the process region shield 232, the station wall 234, the isolation ring 233, and the target 272 substantially enclose and define the processing volume 260.

In some embodiments, the seal formed between the sealing surface 264 of the shutter disc 187 and an upper plate 235A of the sealing assembly 235 is created at a sealing region that is formed by physical contact between the sealing surface 264 of the shutter disc 187 and the upper plate 235A of the sealing assembly 235. In some embodiments, a flexible bellows assembly 235B of the sealing assembly 235 is configured to be extended in the vertical direction as the sealing surface 264 of the shutter disc 187 is placed in contact with the surface of the upper plate 235A of the sealing assembly 235 by use of the lift actuator assembly 268 in the substrate support actuation assembly 290. The compliant nature of the flexible bellows assembly allows any misalignment or planarity differences between the sealing surface 264 of the shutter disc 187 and the upper plate 235A of the sealing assembly 235 to be taken up so that a reliable and repeatable seal can be formed at the sealing surface 264. The bellows assembly 235B may be a stainless steel bellows assembly or Inconel bellows assembly, among others.

FIGS. 4A, 4B, 4C, and 4D are a schematic view, a bottom view, a top view, and a partial enlarged cross-sectional view of the shutter disc 187 that is a split shutter disc formed of two detachable pieces, an inner disc 187A and an outer disc 187B. The outer disc 187B is configured to be disposed on the inner disc 187A. A conical centering feature 402 is disposed in an opening of the inner disc 187A and mates with a corresponding opening 404 formed in the outer disc 187B to align the inner disc 187A with the outer disc 187B when the outer disc 187B is disposed on the inner disc 187A. The outer disc 187B may be detached from the inner disc 187A and replaced with a new outer disc 187B when the outer disc 187B is damaged, without replacing the inner disc 187A. In some embodiments, the outer disc 187B has a radius of between about 301 mm and about 308 mm. The inner disc 187A may be formed of ceramic such as aluminum oxide ($Al_2O_3$), zirconium oxide ($Zr_2O_3$), silicon carbide (SiC), and aluminum nitride (AlN). The outer disc 187B may be formed of any material used in the art for shutter discs, such as titanium (Ti), aluminum-silicon-carbon (AlSiC), stainless steel (SST), aluminum (Al), and any combination of the above. The locating features 212 and the centering features 214 are disposed in and attached to (e.g., press fit) openings in the inner disc 187A and may be formed of the same material as the inner disc 187A. The sealing surface 264 is formed in the outer disc 187B.

Figure 5A:
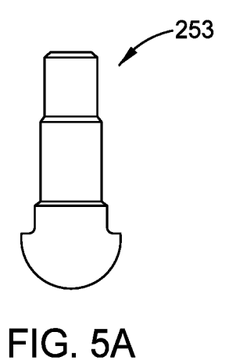
FIGS. 5A and 5B are schematic view of locating pins of a transfer arm according to some embodiments.
Figure 5B:
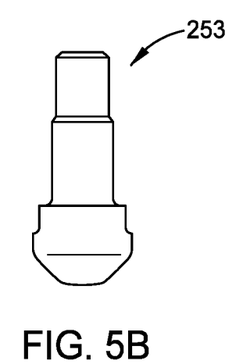
Figure 6A:
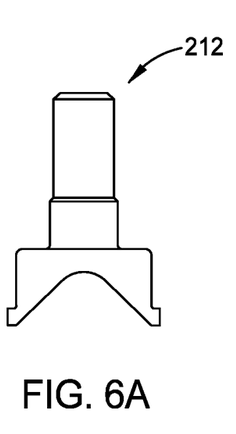
FIGS. 6A, 6B, and 6C are schematic views of locating features according to some embodiments.
Figure 6B:
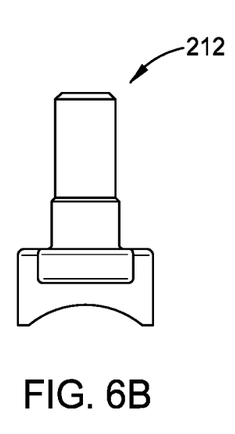
Figure 6C:
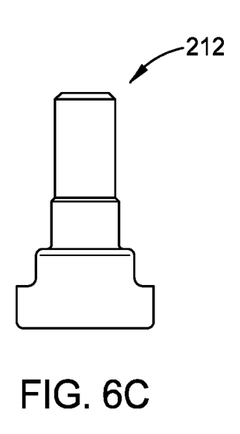

FIGS. 5A and 5B are schematic view of the locating pins 253 of the transfer arm 210 according to some embodiments. FIGS. 6A, 6B, and 6C are schematic views of the locating features 212 that mate with the locating pins 253 according to some embodiments. The locating pins 253 each have a flat shape (shown in FIG. 5A) or a conical shape (shown in FIG. 5B). The locating features 212 have a grooved surface (shown in FIG. 6A) having an inclined angle of between about 30° and 120°, a concave surface (shown in FIG. 6B) having a radius of between about 6 mm and about 19 mm, or a flat surface (shown in FIG. 6C). The locating pins 253 and the locating features 212 may each have a diameter of between about 9 mm and about 19 mm and surface roughness of between about 4 Ra and about 16 Ra.

Figure 7A:
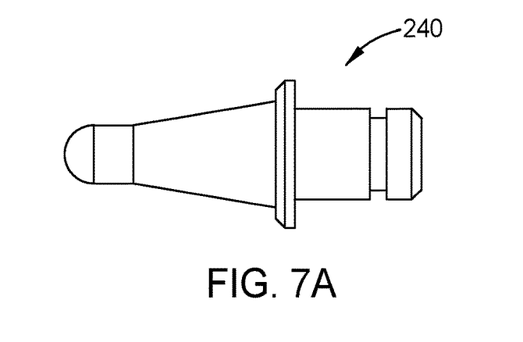
FIG. 7A is a schematic view of an alignment element of a substrate support according to one or more embodiments.
Figure 7B:
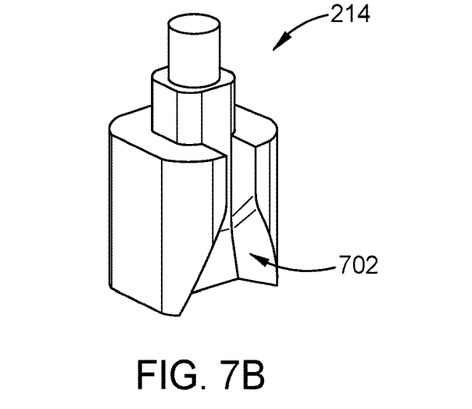
FIG. 7B is a schematic view of a centering feature according to one or more embodiments.
Figure 7C:
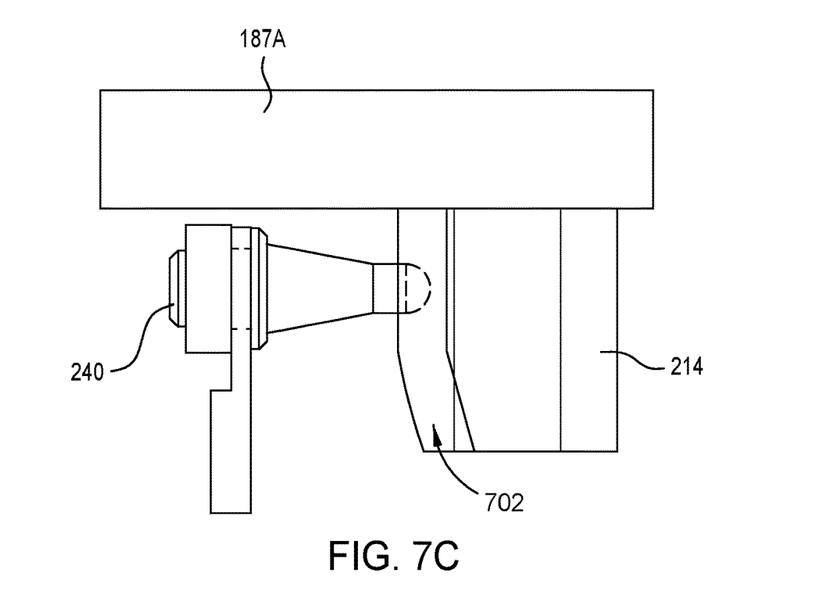
FIG. 7C is a partial enlarged side view of an outer disc according to one or more embodiments.

FIG. 7A is a schematic view of the alignment element 240 of the substrate support 226 according to one or more embodiments. FIG. 7B is a schematic view of the centering feature 214 that engages with the alignment element 240 of the substrate support 226 according to one or more embodiments. FIG. 7C is a partial enlarged side view of the outer disc 187B with the centering feature 214 engaged with the alignment element 240 according to one or more embodiments. When the shutter disc 187 is positioned on the substrate support 226, each of the alignment elements 240 having a pin shape engages in a notch 702 formed in one of the centering features 214, centering the shutter disc 187 over the substrate support 226.

In the example embodiments described above, a split shutter disc formed of two split detachable pieces is provided to protect underlying chamber components from material deposition during processes such as pasting process. The split shutter disc according to the embodiments described above includes features for locating and aligning with respect to a substrate support and to a transfer arm, and thus reduce time for exchanging shutter discs and in turn improve the mechanical throughput.

While the foregoing is directed to embodiments of the present disclosure, other and further embodiments of the disclosure may be devised without departing from the basic scope thereof, and the scope thereof is determined by the claims that follow.

What is claimed is:

1. A shutter disc for use in a cluster tool assembly comprising a processing chamber and a transfer arm, the shutter disc comprising:
   an inner disc; and
   an outer disc configured to be disposed on the inner disc, wherein the inner disc comprises:
      a plurality of locating features configured to mate with locating pins of the transfer arm of the cluster tool assembly; and
      a plurality of notched centering features disposed in and attached to openings in the inner disc and having a notch configured to mate with pin-shaped alignment elements of a substrate support disposed in the processing chamber of the cluster tool assembly.

2. The shutter disc of claim 1, wherein the outer disc comprises a sealing surface configured to form a seal with a portion of a sealing assembly of the processing chamber.

3. The shutter disc of claim 1, wherein the inner disc comprises material selected from a group consisting of aluminum oxide ($Al_2O_3$), zirconium oxide ($Zr_2O_3$), silicon carbide (SiC), and aluminum nitride (AlN).

4. The shutter disc of claim 3, wherein the plurality of locating features comprise the same material as the inner disc.

5. The shutter disc of claim 3, wherein each of the plurality of locating features has a grooved surface.

6. The shutter disc of claim 3, wherein each of the plurality of locating features has a concave surface.

7. The shutter disc of claim 3, wherein each of the plurality of locating features has a flat surface.

8. The shutter disc of claim 3, wherein the plurality of notched centering features comprise the same material as the inner disc.

9. The shutter disc of claim 1, wherein the outer disc comprises material selected from a group consisting of titanium (Ti), aluminum-silicon-carbon (AlSiC), stainless steel (SST), and aluminum (Al).

10. A pedestal assembly for use in a processing chamber, the pedestal assembly comprising:
    a substrate support comprising:
       a plurality of pin-shaped alignment elements configured to mate with a plurality of notched centering features disposed in and attached to openings in an inner disc of a shutter disc; and
    a sealing assembly configured to form a seal with a sealing surface of an outer disc of the shutter disc disposed on the inner disc of the shutter disc.

11. The pedestal assembly of claim 10, wherein the plurality of pin-shaped alignment elements comprise material selected from molybdenum (Mo) or tungsten (W).

12. The pedestal assembly of claim 10, wherein the pin-shaped alignment elements are removably coupled to the substrate support.

13. A cluster tool assembly comprising:
    a central transfer apparatus comprising a transfer arm configured to transfer and support a shutter disc, wherein the transfer arm comprises a plurality of locating pins configured to mate with locating features disposed on an inner disc of the shutter disc disposed on the transfer arm; and
    a processing chamber comprising a pedestal assembly, the pedestal assembly comprising:
       a substrate support comprising:
          a plurality of pin-shaped alignment elements configured to mate with a plurality of notched centering features disposed in and attached to openings in on the inner disc of the shutter disc; and
       a sealing assembly configured to form a seal with a sealing surface of an outer disc of the shutter disc disposed on the inner disc of the shutter disc.

14. The cluster tool assembly of claim 13, wherein each of the plurality of locating pins on the transfer arm has a flat shape or a conical shape.

15. The cluster tool assembly of claim 13 wherein the plurality of locating pins on the transfer arm comprise material selected from molybdenum (Mo) or tungsten (W).

16. The cluster tool assembly of claim 13, wherein the plurality of pin-shaped alignment elements on the substrate support comprise material selected molybdenum (Mo) or tungsten (W).

17. The cluster tool assembly of claim 13, wherein the plurality of pin-shaped alignment elements are removably coupled to the substrate support.

* * * * *